(12) United States Patent
Benna et al.

(10) Patent No.: US 10,032,868 B2
(45) Date of Patent: Jul. 24, 2018

(54) HIGH PERFORMANCE SUPER-BETA NPN (SBNPN)

(71) Applicant: TEXAS INSTRUMENTS INCORPORATED, Dallas, TX (US)

(72) Inventors: Bernhard Benna, Nandlstadt (DE); Wolfgang Schwartz, Au (DE); Berthold Georg Staufer, Moosburg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/261,024

(22) Filed: Sep. 9, 2016

(65) Prior Publication Data

US 2018/0076283 A1 Mar. 15, 2018

(51) Int. Cl.
*H01L 29/08* (2006.01)
*H01L 21/265* (2006.01)
*H01L 21/266* (2006.01)
*H01L 29/73* (2006.01)
*H01L 29/732* (2006.01)

(52) U.S. Cl.
CPC ........ *H01L 29/0804* (2013.01); *H01L 21/266* (2013.01); *H01L 21/2652* (2013.01); *H01L 29/732* (2013.01); *H01L 29/7315* (2013.04)

(58) Field of Classification Search
CPC ............ H01L 27/0262; H01L 29/0804; H01L 29/7315; H01L 21/2652
USPC .................................... 438/142, 312; 257/49
See application file for complete search history.

(56) References Cited

U.S. PATENT DOCUMENTS

| | | |
|---|---|---|
| 5,851,864 A | 12/1998 | Ito et al. |
| 6,459,140 B1 | 10/2002 | Johansson et al. |
| 7,572,706 B2 | 8/2009 | Babcock et al. |
| 8,450,179 B2 | 5/2013 | El-Kareh et al. |
| 2002/0036326 A1* | 3/2002 | DeJong ..................... G05F 3/30 257/369 |
| 2002/0197807 A1* | 12/2002 | Jagannathan ....... H01L 21/8249 438/312 |
| 2008/0048215 A1* | 2/2008 | Davies ................ H01L 27/0262 257/274 |
| 2009/0160017 A1 | 6/2009 | Ito |
| 2011/0169137 A1 | 7/2011 | Lin et al. |

FOREIGN PATENT DOCUMENTS

EP 0 347 550 A2 12/1989

\* cited by examiner

*Primary Examiner* — Bo Fan
(74) *Attorney, Agent, or Firm* — Ronald O. Neerings; Charles A. Brill; Frank D. Cimino (57) ABSTRACT

A method for making a super β NPN (SBNPN) transistor includes depositing a tetraethyl orthosilicate (TEOS) layer on a P type epitaxial layer; depositing a nitride layer on the TEOS layer; patterning an emitter region of the SBNPN transistor by selectively etching away portions of the nitride layer and the TEOS layer; depositing a second TEOS layer on top of the nitride layer, along sides of the nitride layer and the TEOS layer, and on top of the P type epitaxial layer; and implanting the P type epitaxial layer through the second TEOS layer with N type ions to form the emitter region of the SBNPN transistor.

22 Claims, 7 Drawing Sheets

HIGH PERFORMANCE SUPER-BETA NPN (SBNPN)

BACKGROUND

NPN transistors have two N type regions surrounding a P type region. One of the N type regions is the collector, the P type region is the base, and the second one of the N type regions is the emitter. Depending upon how the NPN transistor is voltage biased, the NPN transistor will have a different mode of operation. When the emitter-base junction is reverse biased and the collector-base junction is reverse biased, the NPN transistor operates in a cutoff mode. When the emitter-base junction is forward biased and the collector-base junction is reverse biased, the NPN transistor operates in an active mode, and when the emitter-base junction is forward biased and the collector-base junction is forward biased, the NPN transistor operates in the saturation mode. The active mode is used when the transistor is to be used as an amplifier, and the cutoff mode and the saturation mode are used when the transistor is to be used as a switch.

One parameter of an NPN transistor is the common-emitter current gain, which is often known as $\beta$ or $H_{FE}$. When in the active mode, the common-emitter current gain is the ratio of the collector current over the base current. For an NPN transistor, the common-emitter current gain may be in the range of 50 to 200. For a super-beta NPN (SBNPN) transistor, the common-emitter current gain may be, for example, 1,000 or more.

SUMMARY

In one embodiment, the disclosure includes a method for making an SBNPN transistor that comprises depositing a tetraethyl orthosilicate (TEOS) layer on a P type epitaxial layer, and depositing a nitride layer on the TEOS layer. An emitter region of the SBNPN transistor is patterned by selectively etching away portions of the nitride layer and the TEOS layer. A second TEOS layer is deposited on top of the nitride layer, along sides of the nitride layer and the TEOS layer, and on top of the P type epitaxial layer. The P type epitaxial layer is implanted through the second TEOS layer with N type ions to form the emitter region of the SBNPN transistor.

In another embodiment, the disclosure includes a method for making an SBNPN transistor that comprises depositing a screen oxide layer, a first TEOS layer, a nitride layer, and a first photoresist layer on a P type epitaxial layer. The first photoresist layer is patterned to expose an emitter region of the SBNPN transistor. The screen oxide layer, the first TEOS layer, and the nitride layer in the emitter region of the SBNPN transistor are etched away. The first photoresist layer is removed, and a second TEOS layer is deposited over the nitride layer and over the P type epitaxial layer in the emitter region of the SBNPN transistor. A second photoresist layer is deposited on the nitride layer, and the second photoresist layer is patterned to expose an emitter implant region of the SBNPN transistor. The P type epitaxial layer is implanted through the second TEOS layer to form the emitter region of the SBNPN transistor.

In yet another embodiment, the disclosure includes an SBNPN transistor that comprises a base, an emitter, and a collector. The emitter comprises a nitride layer and a first TEOS layer on top of a P type epitaxial layer. The second TEOS layer is deposited on the nitride layer and the first TEOS layer. The second TEOS layer fills in undercut regions of the nitride layer and the first TEOS layer, and the second TEOS layer comprises a homogenous screen oxide for an emitter implant step.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

When manufacturing SBNPN transistors, the common-emitter current gain can vary within a wafer, can vary from wafer-to-wafer, and can vary from lot-to-lot. Ideally, this variation would be reduced to a minimum such that SBNPN transistors with consistent and predictable common-emitter current gains could be produced. Embodiments of this disclosure include SBNPN transistors and methods of making SBNPN transistors that produce SBNPN transistors with more consistent and predictable common-emitter current gains. In one example, an existing oxide layer is removed, and a new oxide layer is deposited that provides better uniformity in the subsequent emitter ion implant step than at least some conventional SBNPN transistors. The better uniformity in the subsequent emitter ion implant step results in reduced variation of the common-emitter current gain variation within a wafer, from wafer-to-wafer, and from lot-to-lot.

Figure 1:
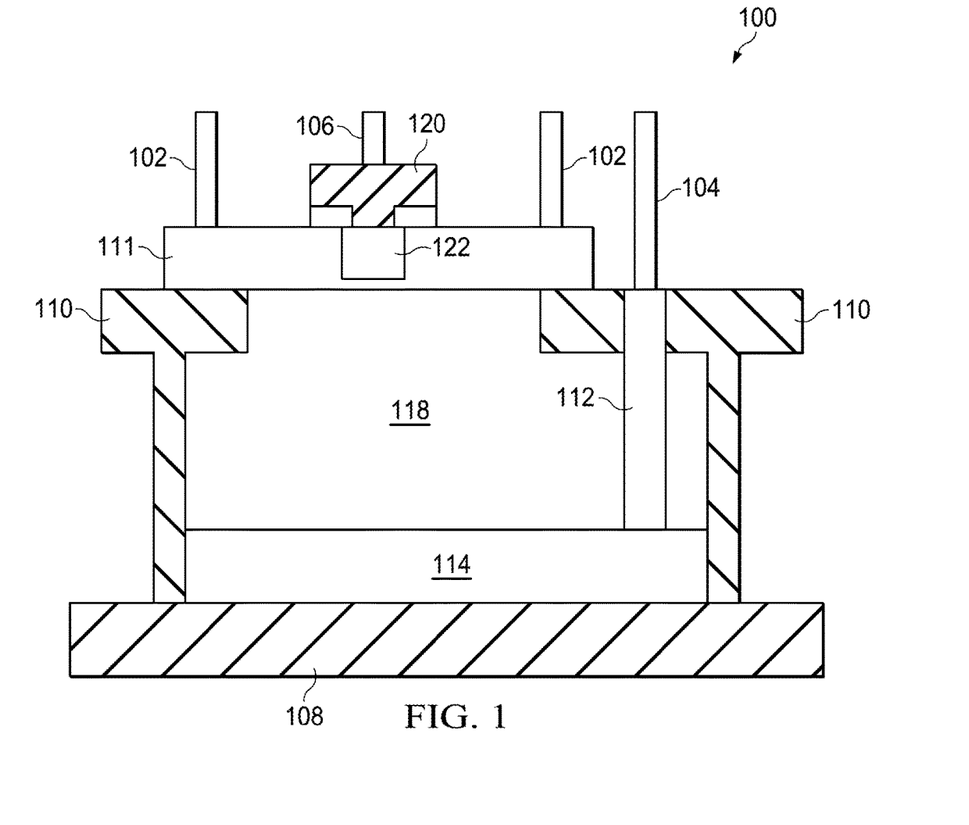
FIG. 1 shows a cross-sectional view of an SBNPN transistor in accordance with various examples.

FIG. 1 shows a cross-sectional view of one embodiment of an SBNPN transistor 100 in accordance with the disclosed embodiments. Although examples are provided herein of SBNPN transistors and associated methods, the embodiments are not limited to any particular type of transistor and may be practiced in other types of transistors. SBNPN transistor 100 in FIG. 1 has one or more base terminals 102, one or more collector terminals 104, and one or more emitter terminals 106. The one or more base terminals 102, the one or more collector terminals 104, and the one or more emitter terminals 106 may be used as connections for electrical signals for the SBNPN transistor 100. The SBNPN transistor 100 is supported by a buried oxide layer 108. The buried oxide layer 108 works along with one or more isolation trenches 110 to electrically isolate the SBNPN transistor 100. For example, the buried oxide layer 108 electrically isolates the SBNPN transistor 100 from adjacent SBNPN transistors and other devices which may be formed on the same wafer as SBNPN 100.

In some embodiments, the base portion of the SBNPN transistor comprises the base terminal 102 and a P type epitaxial layer 111. The collector portion of the SBNPN transistor may comprise the collector terminal 104 and a plurality of N type regions. The plurality of N type regions of the collector portion includes a vertical N type channel 112, a horizontal N type channel 114, and an N type epitaxial layer 118. Thus, in the example of FIG. 1, the plurality of N type regions forming part of the collector portion includes three N type regions. The emitter portion of the SBNPN transistor comprises the emitter terminal 106, a polysilicon structure 120, and an N type emitter region 122.

Figure 2:
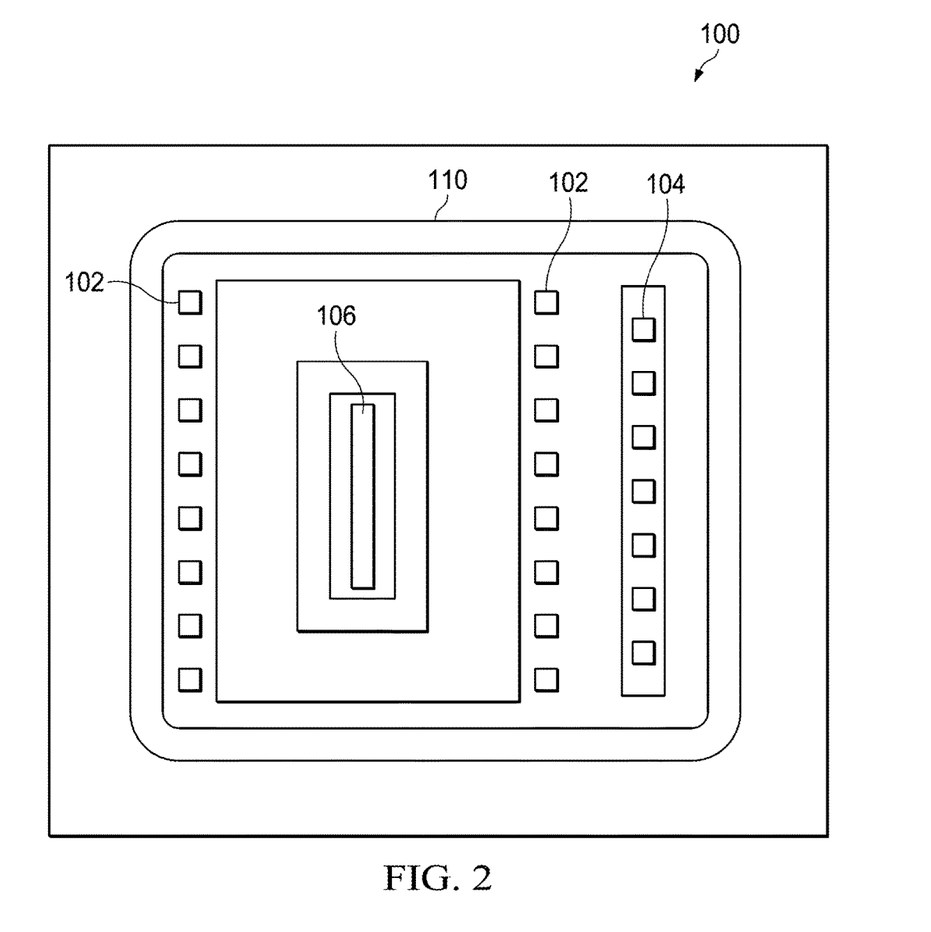
FIG. 2 shows a top-down view of an SBNPN transistor in accordance with various examples.

FIG. 2 shows a top-down view of the SBNPN transistor 100 of FIG. 1. In the example shown in FIG. 2, SBNPN transistor 100 has sixteen base terminals 102, seven collector terminals 104, and one elongated emitter terminal 106. Embodiments are not however limited to any particular number of terminals, shape of terminals, or size of terminals, and embodiments may have a different number of terminals, different shapes of terminals, and different sizes of terminals from what is shown in FIG. 2.

Figure 3:
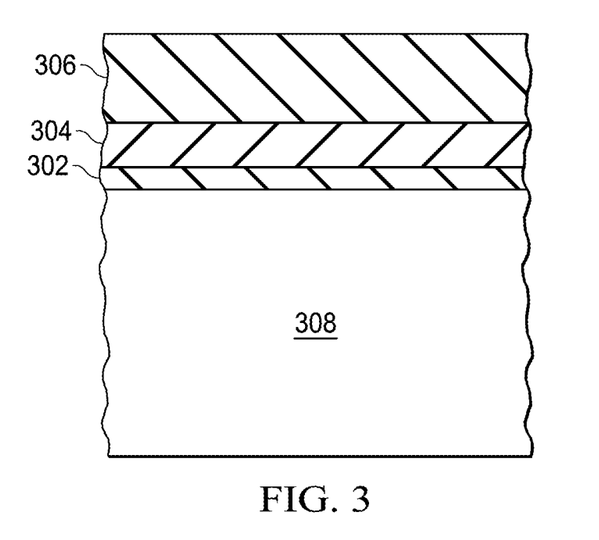
FIGS. 3-10 show cross-sectional views of an SBNPN transistor being manufactured in accordance with various examples.

FIGS. 3-10 show cross-sectional views of an SBNPN transistor being manufactured according to one embodiment of the present disclosure. Specifically, FIGS. 3-10 show an embodiment of a method of manufacturing an emitter region (e.g., polysilicon structure 120 and N type emitter region 122 in FIG. 1). In FIG. 3, a screen oxide layer 302, a TEOS layer 304, and a nitride layer 306 are deposited on a P type epitaxial layer 308. In one embodiment, the screen oxide layer 302 is about 2-5 nanometers (nm), the TEOS layer 304 is about 10-30 nm, and the nitride layer is about 50-80 nm. However, other embodiments are not limited to any particular thicknesses, and the screen oxide layer 302, the TEOS layer 304, and the nitride layer 306 can have different thicknesses.

Figure 4:
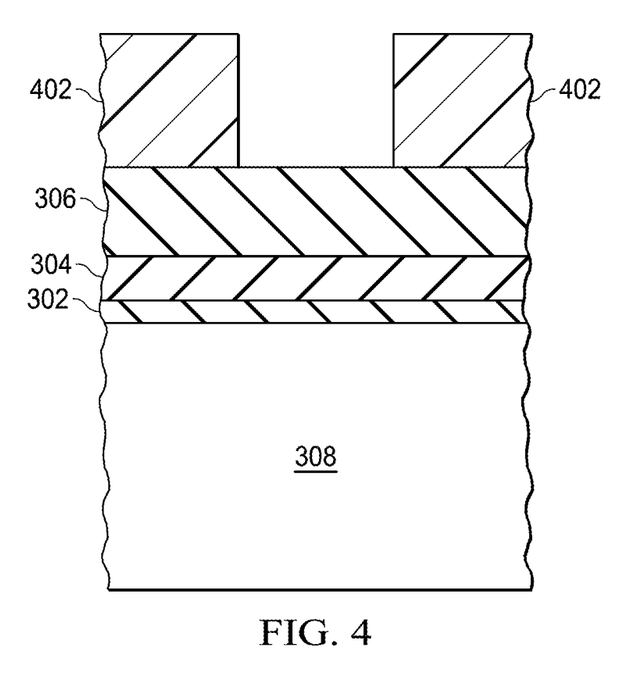

In FIG. 4, a layer of photoresist 402 is applied to the top of the nitride layer 306, and the layer of photoresist 402 is patterned to form the area that will become the emitter of the SBNPN transistor. For example, the entire surface of the nitride layer 306 is applied with photoresist. A photomask is then used to selectively shine light on areas of the photoresist, and a developing solution is used to remove the unwanted photoresist. The openings in the photoresist will be used to etch away material to form the emitter.

Figure 5:
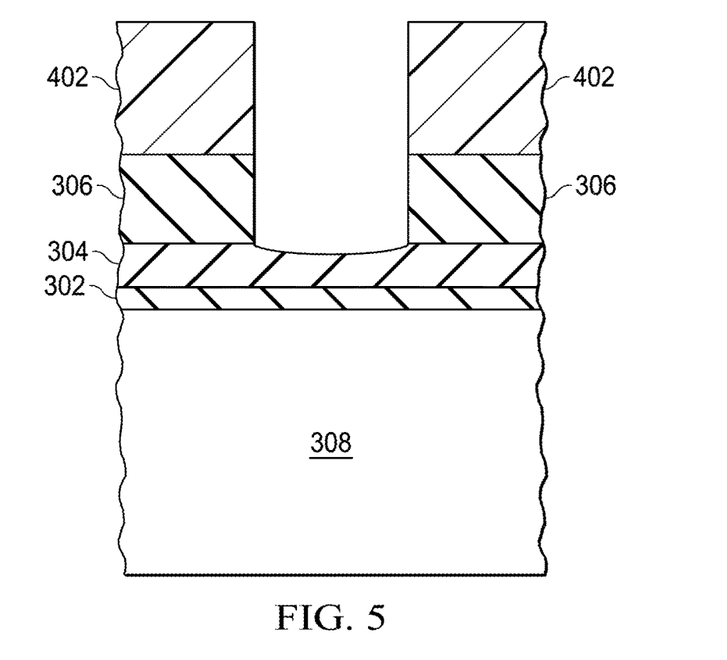

In FIG. 5, the nitride layer 306 and a portion of the TEOS layer 304 that are not covered by the photoresist layer 402 are etched away. The TEOS layer 304 is etched away such that about 3-12 nm of the TEOS layer 304 remain.

Figure 6:
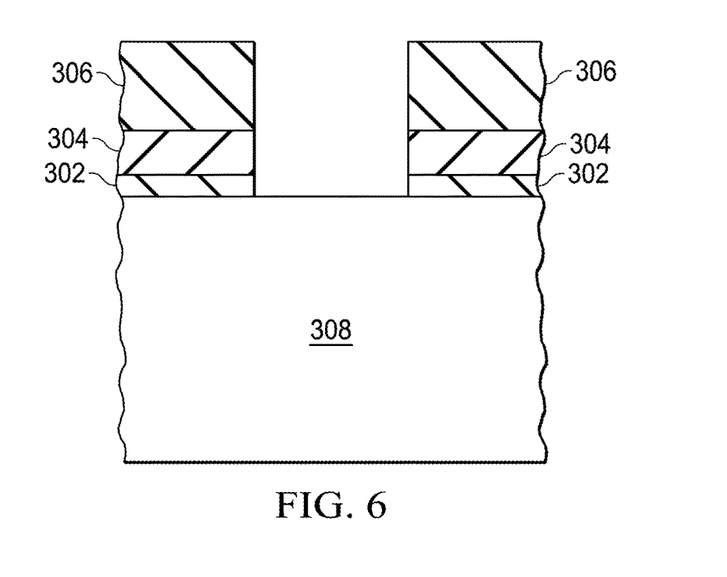

In FIG. 6, the photoresist layer 402 from FIGS. 4-5 is first removed. In one embodiment, the photoresist layer 402 is removed by first performing a plasma ashing step and then performing a wet etch (e.g., an $H_2SO_4$ and $H_2O_2$ wet etch) to remove any remaining photoresist. After the photoresist layer 402 is removed, another wet etch is performed to remove the exposed TEOS layer 304 in the emitter region. For example, a hydrofluoric acid (HF) wet etch may be performed. Embodiments are not however limited to any particular type of etch to remove the exposed TEOS layer 304.

Figure 7:
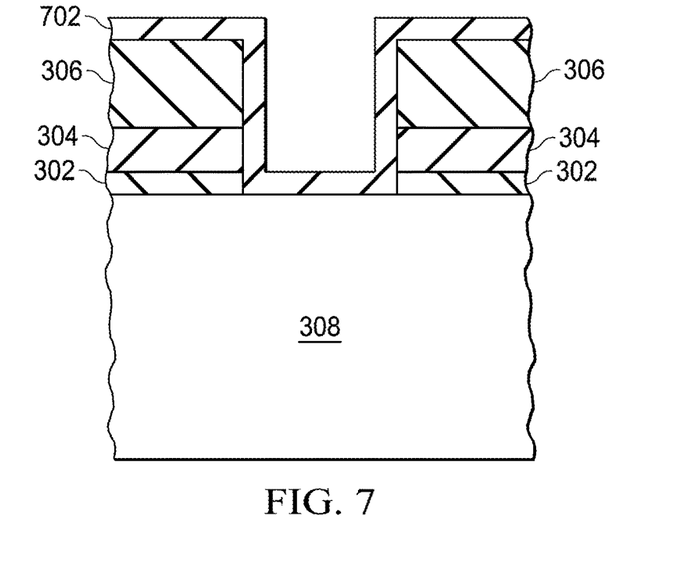

In the example of FIG. 7, a second TEOS layer 702 is deposited over the top of the nitride layer 306, along the sides of nitride layer 306, TEOS layer 304, and screen oxide layer 302, and over the top of the exposed P type epitaxial layer 308. In an embodiment, the second TEOS layer 702 is about 2-8 nm and may be deposited using a low temperature (e.g., 640 degrees Celsius), low deposition rate process. The second TEOS layer 702 illustratively performs two functions. First, the second TEOS layer 702 acts as a homogenous screen oxide for the subsequent emitter implant step. Second, the second TEOS layer 702 acts to refill any undercut of the nitride layer 306, TEOS layer 304, and screen oxide layer 302 that occurs due to the previously discussed wet etch that removes the exposed TEOS layer 304.

Figure 8:
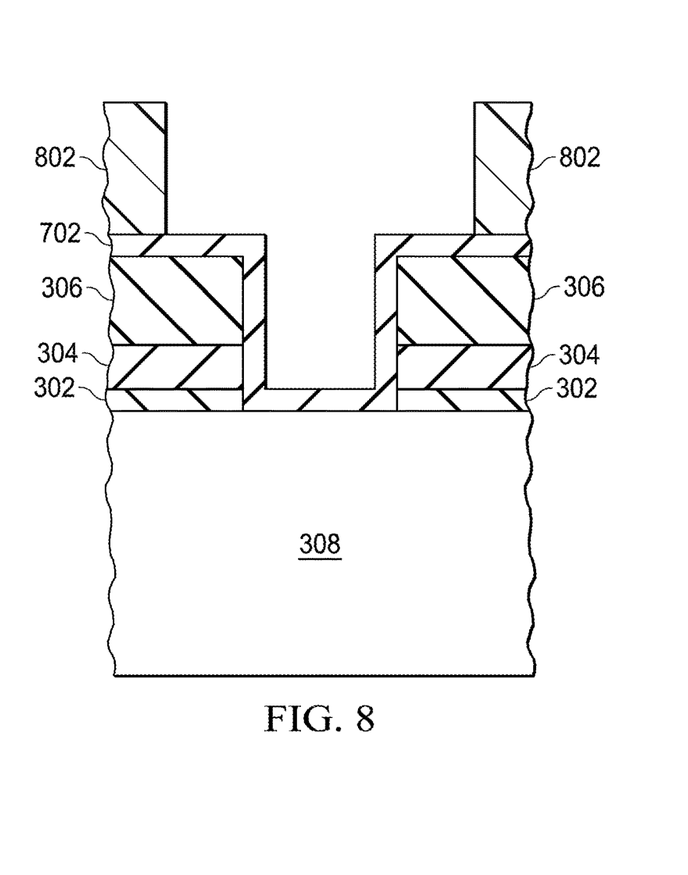

In FIG. 8, a second layer of photoresist 802 is applied to the top of the second TEOS layer 702. The layer of photoresist 802 is patterned to expose the portions of SBNPN transistor that will receive the emitter implant step and to protect the portions of the SBNPN transistor that will be blocked from receiving the emitter implant step.

Figure 9:
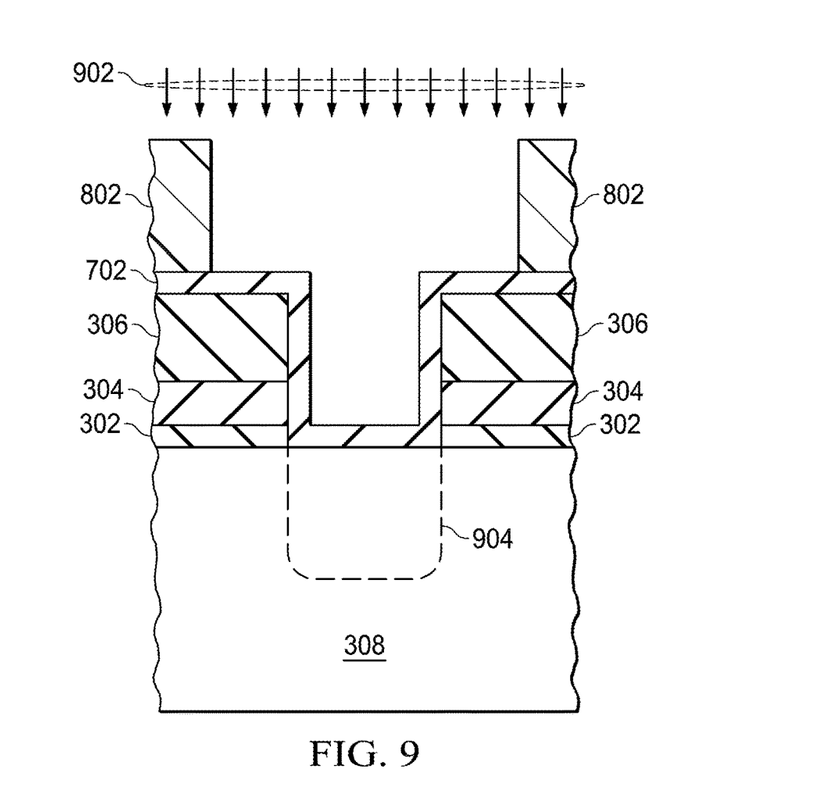

In FIG. 9, the emitter implant step is performed. N type ions 902 (e.g., arsenic ions) are projected onto the SBNPN transistor. The exposed areas that include the areas where the second TEOS layer 702 covers the P type epitaxial layer 308 receive the implant. The second TEOS layer 702 acts as a screen oxide layer allowing the N type ions 902 to pass through and penetrate the P type epitaxial layer 308. This forms an N type region 904 that acts as the emitter.

Figure 10:
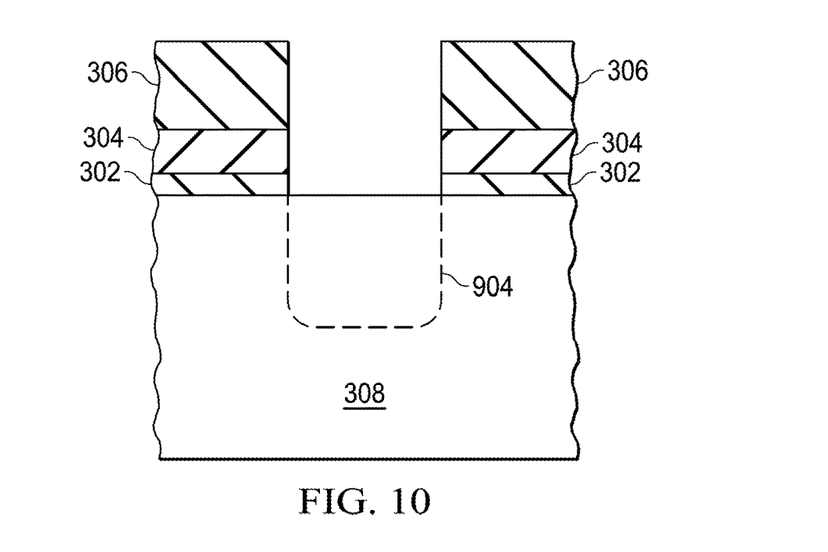

In FIG. 10, the layer of photoresist 802 from FIGS. 8-9 is removed. In one embodiment, the layer of photoresist 802 is removed by performing a plasma ashing step and then performing a wet etch (e.g., an $H_2SO_4$ and $H_2O_2$ wet etch) to remove any remaining photoresist. After the layer of photoresist 802 is removed, another wet etch may be performed to remove the exposed TEOS layer 702 in the emitter region. Embodiments are not limited to any particular type of etch to remove the exposed TEOS layer 304 and include any etch that removes the exposed TEOS layer 304.

Figure 11:
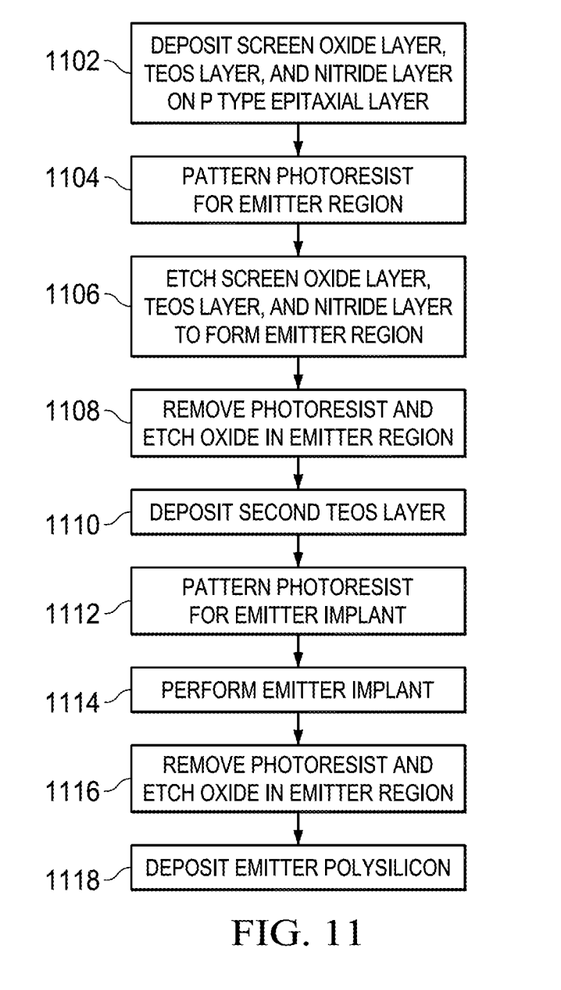
FIG. 11 shows a process flowchart of a method of manufacturing an emitter region of an SBNPN transistor in accordance with various examples.

FIG. 11 shows a process flowchart of a method of manufacturing an emitter region of an SBNPN transistor according to one embodiment of the present disclosure. At block 1102, a screen oxide layer, a TEOS layer, and a nitride layer are deposited on a P type epitaxial layer. At block 1104, a layer of photoresist is deposited on the nitride layer and is patterned for the emitter region. At block 1106, the areas of the nitride layer that are not covered by photoresist are etched away and a thin film of oxide (e.g., 50-105 A) is left covering the P type epitaxial layer. At block 1108, the layer of photoresist is removed and the thin film of oxide is etched away. At block 1110, a second TEOS layer is deposited. The second TEOS layer acts as a homogenous screen oxide for the subsequent emitter implant step, and the second TEOS layer acts to refill any undercut of the nitride layer, the first TEOS layer, and the screen oxide layer. At block 1112, a second layer of photoresist is deposited on the second TEOS layer and is patterned for the emitter implant. At block 1114, the emitter implant is performed to form the emitter N type region. At block 1116, the second layer of photoresist is removed and the thin film of oxide in the emitter region is etched away. At block 1118, the emitter polysilicon is deposited to form a polysilicon structure (e.g., polysilicon structure 120 in FIG. 1).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for making a super β NPN (SBNPN) transistor having a common-emitter current gain of 1000 or more, comprising:
depositing a tetraethyl orthosilicate (TEOS) layer on a P type epitaxial layer;
depositing a nitride layer on the TEOS layer;
patterning an emitter region of the SBNPN transistor by selectively etching away portions of the nitride layer and the TEOS layer;
depositing a second TEOS layer on top of the nitride layer, along sides of the nitride layer and the TEOS layer, and on top of the P type epitaxial layer; and
implanting the P type epitaxial layer through the second TEOS layer with N type ions to form the emitter region of the SBNPN transistor.

2. The method of claim 1, wherein depositing the second TEOS layer comprises filling in undercut regions of the nitride layer and the TEOS layer.

3. The method of claim 1, wherein depositing the second TEOS layer comprises depositing the second TEOS layer with a low temperature, low deposition rate process.

4. The method of claim 1, wherein depositing the second TEOS layer comprises depositing a homogenous screen oxide for the implant step.

5. The method of claim 1, further comprising removing the TEOS layer within the emitter region of the SBNPN transistor before depositing the second TEOS layer.

6. The method of claim 1, further comprising depositing a layer of photoresist on the second TEOS layer before the implant step.

7. The method of claim 1, wherein implanting the P type epitaxial layer through the second TEOS layer with N type ions comprises implanting the P type epitaxial layer with arsenic.

8. A method for making a super βNPN (SBNPN) transistor having a common-emitter current gain of 1000 or more, comprising:
depositing a screen oxide layer, a first tetraethyl orthosilicate (TEOS) layer, a nitride layer, and a first photoresist layer on a P type epitaxial layer;
patterning the first photoresist layer to expose an emitter region of the SBNPN transistor;
etching away the screen oxide layer, the first TEOS layer, the nitride layer in the emitter region of the SBNPN transistor;
removing the first photoresist layer;
depositing a second TEOS layer over the nitride layer and over the P type epitaxial layer in the emitter region of the SBNPN transistor;
depositing a second photoresist layer on the second TEOS layer;
patterning the second photoresist layer to expose an emitter implant region of the SBNPN transistor; and
implanting the P type epitaxial layer through the second TEOS layer to form the emitter region of the SBNPN transistor.

9. The method of claim 8, further comprising removing the second photoresist layer.

10. The method of claim 9, further comprising etching away the second TEOS layer in the emitter region of the SBNPN transistor.

11. The method of claim 10, further comprising depositing an emitter polysilicon layer.

12. The method of claim 8, wherein depositing the second TEOS layer comprises filling in undercut regions of the nitride layer and the first TEOS layer.

13. The method of claim 8, wherein depositing the second TEOS layer comprises depositing the second TEOS layer with a low temperature, low deposition rate process.

14. The method of claim 8, wherein depositing the second TEOS layer comprises depositing a homogenous screen oxide for the implant step.

15. A super β NPN (SBNPN) transistor having a common-emitter current gain of 1000 or more, comprising:
a base;
an emitter; and
a collector,
wherein the emitter is formed by:
depositing a first tetraethyl orthosilicate (TEOS) layer on a P type epitaxial layer;
depositing a nitride layer on the first TEOS layer;
patterning an emitter region of the SBNPN transistor by selectively etching away portions of the nitride layer and the first TEOS layer;
depositing a second TEOS layer on top of the nitride layer, along sides of the nitride layer and the first TEOS layer, and on top of the P type epitaxial layer; and
implanting the P type epitaxial layer through the second TEOS layer to form the emitter region of the SBNPN transistor.

16. The SBNPN transistor of claim 15, wherein the P type epitaxial layer is implanted with N type ions.

17. The SBNPN transistor of claim 16, wherein the N type ions comprise arsenic.

18. The SBNPN transistor of claim 15, wherein the second TEOS layer comprises a low temperature, low deposition rate TEOS layer.

19. The SBNPN transistor of claim 15, wherein the emitter comprises a polysilicon layer.

20. The SBNPN transistor of claim 15, wherein the emitter comprises a screen oxide layer.

21. A method for making a super β NPN (SBNPN) transistor having a common-emitter current gain of at least 1000, comprising:
depositing a tetraethyl orthosilicate (TEOS) layer on a P type epitaxial layer;
depositing a nitride layer on the TEOS layer;
patterning an emitter region of the SBNPN transistor by selectively etching away portions of the nitride layer and the TEOS layer;
depositing a second TEOS layer on top of the nitride layer, along sides of the nitride layer and the TEOS layer, and on top of the P type epitaxial layer; and
implanting the P type epitaxial layer through the second TEOS layer with N type ions to form the emitter region of the SBNPN transistor.

22. The method of claim 1, wherein the SBNPN transistor comprises a common-emitter gain that is substantially higher than a standard NPN transistor fabricated in a process technology that is the same as that of the SBNPN transistor.

* * * * *